United States Patent [19]

Hayashi et al.

[11] Patent Number: 4,891,355

[45] Date of Patent: Jan. 2, 1990

[54] METHOD FOR PRODUCING SUPERCONDUCTING CIRCUIT

[75] Inventors: Noriki Hayashi; Satoshi Takano; Kenji Miyazaki; Noriyuki Yoshida, all of Osaka, Japan

[73] Assignee: Sumitomo Electric Industries, Ltd., Osaka, Japan

[21] Appl. No.: 234,976

[22] Filed: Aug. 22, 1988

[30] Foreign Application Priority Data

Aug. 22, 1987 [JP] Japan ................................. 62-208882

[51] Int. Cl.$^4$ ........................................... H01L 39/00
[52] U.S. Cl. ................................. 505/1; 204/192.24; 427/431; 427/531; 427/62; 427/63; 29/599; 505/815; 505/816; 505/817; 505/818; 505/819; 505/820; 505/822; 505/731; 505/732; 505/739

[58] Field of Search ............... 204/192.24; 427/62-63, 427/43.1, 53.1; 505/1, 815, 816, 817, 818, 819-820, 822; 29/599; 219/121.6, 121.66, 121.85

[56] References Cited

PUBLICATIONS

M. Scheuermann et al., *Appl. Phys. Lett.*, vol. 51, No. 23, Dec. 1987, pp. 1951-1953.

M. Rothschild et al., *Appl. Phys. Lett.*, vol. 52, No. 5, Feb. 1988, pp. 404-406.

*Primary Examiner*—Aaron Weisstuch
*Attorney, Agent, or Firm*—Pennie & Edmonds

[57] ABSTRACT

A method of producing a superconducting circuit by forming a film having a superconducting phase on a substrate and applying a laser beam to a part of the superconducting phase to cause transition of the part of the superconducting phase into a non-superconducting phase.

9 Claims, 3 Drawing Sheets

METHOD FOR PRODUCING SUPERCONDUCTING CIRCUIT

BACKGROUND OF THE INVENTION

Field of the Invention

The present invention relates to a method of producing a superconducting circuit on a substrate.

Description of the Related Art

In order to produce a superconducting circuit on a substrate by a well-known method, the upper surface of the substrate is masked to form a superconducting thin film only in a prescribed portion or ion etching is performed on a superconducting thin film formed on the substrate to partially scrape off the thin film.

However, such a method has disadvantages of difficulty in fine working, inferiority in working accuracy and complexity of the process.

SUMMARY OF THE INVENTION

An object of the present invention is to provide a method of producing a superconducting circuit, which can achieve fine working with high accuracy through simple steps.

According to the present invention, a method is disclosed for producing a superconducting circuit which comprises a superconducting phase showing superconductivity under a prescribed working temperature and a nonsuperconducting phase showing no superconductivity under the prescribed working temperature. The method comprises a step of forming a film having the superconducting phase on a substrate and a step of applying a laser beam to a part of the superconducting phase of the film to thereby cause a transition of the part of the superconducting phase into the non-superconducting phase.

The laser employed in the present invention is not particularly restricted but appropriately selected in consideration of a temperature for heating the film for causing transition of the exposed part into the non-superconducting state, the laser beam diameter and the like. Examples of preferable lasers are a YAG laser, an excimer laser, a $CO_2$ laser and the like.

In the present invention, the film formed on the substrate must be transitive into a non-superconducting state by heat treatment under a high temperature. Such a film is prepared from a ceramics superconductive material, for example. Well-known ceramics superconductive materials are those having perovskite structure such as Y-Ba-Cu oxides, Y-Sr-Cu oxides, La-Ba-Cu oxides and La-Sr-Cu oxides. Elements of such materials may be partially replaced by other elements.

Further, the film formed on the substrate in the present invention must already be in a superconducting state before exposure to the laser beam. In general, a film which is composed of a superconductive material and formed on a substrate by sputtering or the like is in a non-superconducting state immediately after formation. In such case, the film is brought into a superconducting state by prescribed heat treatment prior to being exposed to the laser beam.

According to the present invention, the superconducting film is subjected to heat treatment by partial exposure to the laser beam, to be changed in composition, crystal structure and the like, so that the part exposed to the laser beam is brought into a non-superconducting phase showing no superconductivity. The film remains superconducting except for the part exposed to the laser beam. Thus, the superconducting circuit can be produced by this superconducting phase and the non-superconducting phase which was exposed to the laser beam.

In the present invention, the superconducting circuit is produced by the laser beam, the diameter of which can be considerably finely worked. According to the present invention, therefore, the superconducting circuit can be finely worked in high accuracy through simple steps.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
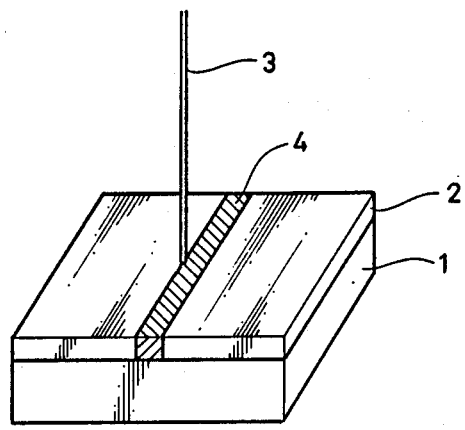
FIG. 1 is a perspective view showing an embodiment of the present invention during scanning with a laser beam.

In FIG. 1, the (100) surface of a strontium titanate substrate 1 which is 15×15 mm in size was employed as a substrate surface for a thin film 2 of $Y_1Ba_{1.9}Cu_{2.8}O_x$ formed on the substrate to 0.7 μm in thickness by RF magnetron sputtering. The sputtering atmosphere was a mixed gas of argon and oxygen containing 50% of oxygen at a pressure of $8 \times 10^{-2}$ Torr., and the substrate temperature was 650° C.

The thin film 2 thus obtained was subjected to heat treatment with the substrate 1 in flowing oxygen at 920° C. for two hours, to convert the film 2 into a superconducting state.

A Nd:YAG laser of 1.06 μm in wavelength was employed to scan the film 2 with a laser beam 3 as shown in FIG. 1, to thereby define a part 4 exposed to the laser beam 3 under conditions of laser power of 100 W/cm², a scanning speed of 1 mm/sec., and a laser beam spot diameter of 100 μm in an atmosphere of air. The exposed part 4 is illustrated in a hatched manner in FIG. 1. A platinum-rhodium thermocouple was placed in proximity to the exposed part 4, to measure its temperature. The result was 2000° C.

Figure 2:
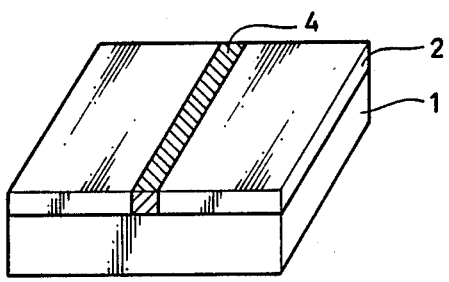
FIG. 2 is a perspective view showing the embodiment after scanning with the laser beam.

Then, as shown in FIG. 2, a film 2 was scanned 50 times with a laser beam at intervals of 100 μm, to define an exposed part 4 of 5 mm in width.

Figure 3:
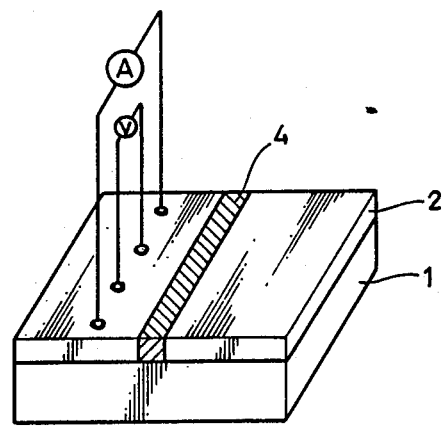
FIG. 3 is a perspective view illustrating a method of measuring the temperature-resistance characteristic of a part not exposed to the laser beam.

As shown in FIG. 3, terminals were mounted on portions not exposed to the laser beam, to measure the temperature-resistance characteristic by a four-terminal method. The temperature at which all resistance was lost, i.e., the critical temperature, was 86° K. The measurement limit of the apparatus was $10^{-7} \Omega$.

Figure 4:
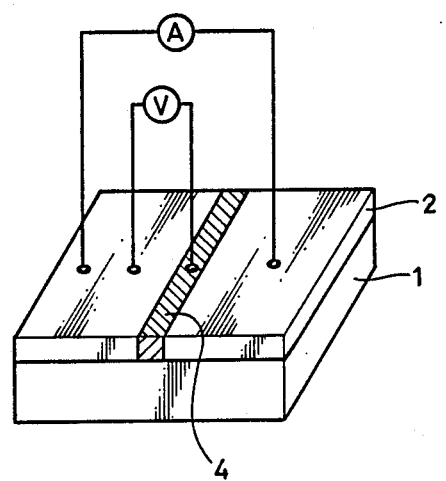
FIG. 4 is a perspective view illustrating a method of measuring the temperature-resistance characteristic by mounting a terminal on a part exposed to the laser beam.

Then, as shown in FIG. 4, one of four terminals was mounted on the exposed part 4 to measure the temperature-resistance characteristic. No superconducting state was attained at the temperature of liquid helium (4° K).

As is obvious from comparison of the aforementioned results of temperature-resistance characteristics, it has been confirmed that the exposed part 4 was brought into a non-superconducting phase showing no superconductivity by exposure to the laser beam.

Referring to FIGS. 2 to 4, numeral 1 indicates a substrate, numeral 2 indicates a film, and numeral 4 indicates the part exposed to the laser beam.

EXAMPLE 2

Figure 5:
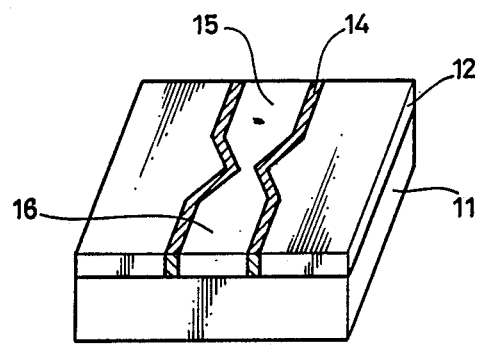
FIG. 5 is a perspective view for illustrating another embodiment of the present invention.

Similar to Example 1, a film was formed on a substrate, and exposed to a laser beam from a Nd:YAG laser (1.06 $\mu$m in wavelength) in an atmosphere of air. The laser beam was adjusted to 100 $\mu$m in spot diameter, with a scanning speed of 1 cm/sec and laser power of 100 W/cm$^2$. FIG. 5 shows a film 12 formed on a substrate 11, which was exposed to the laser beam to define exposed parts 14.

Figure 6:
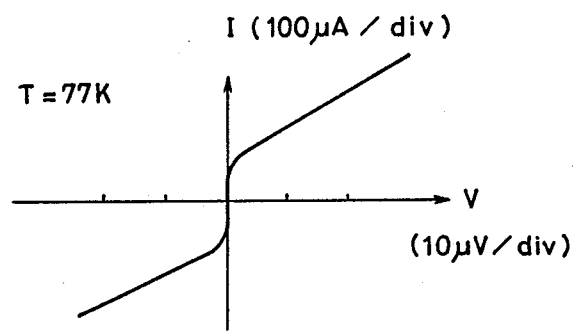
FIG. 6 illustrates the current-voltage characteristic of the embodiment shown in FIG. 5.

Superconducting phases 15 and 16 located between the exposed parts 14 were employed as terminals to measure the current-voltage characteristic at a temperature of 77° K. FIG. 6 shows the result. As is obvious from FIG. 6, it has been confirmed that a boundary portion between the superconducting phases 15 and 16 formed a bridge-type Josephson junction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a superconducting circuit comprising a superconducting phase showing superconductivity at a prescribed working temperature and a non-superconducting phase showing no superconductivity at said prescribed working temperature, said method comprising:
    a step of forming a film having said superconducting phase on a substrate; and
    a step of applying a laser beam to a part of said superconducting phase on said film to cause transition of said part of said superconducting phase into said non-superconducting phase.

2. A method in accordance with claim 1, wherein said film forming step comprises a step of forming said film by sputtering.

3. A method in accordance with claim 2, wherein said film forming step further comprises a step of performing heat treatment in an oxygen atmosphere of said film formed by said sputtering.

4. A method in accordance with claim 1, wherein said film forming step comprises a step of forming a film of a ceramics superconductive material.

5. A method in accordance with claim 4, wherein said film forming step comprises a step of forming a film of at least one ceramics superconducting material selected from a group consisting of Y-Ba-Cu oxides, Y-Sr-Cu oxides, La-Ba-Cu oxides and La-Sr-Cu oxides.

6. A method in accordance with claim 1, wherein said laser beam applying step comprises a step of applying a laser beam from a YAG laser.

7. A method in accordance with claim 1, wherein said laser beam applying step comprises a step of applying a laser beam from an excimer laser.

8. A method in accordance with claim 1, wherein said laser beam applying step comprises a step of applying a laser beam from a CO$_2$ laser.

9. A method in accordance with a superconducting circuit formed by a superconducting phase showing superconductivity at a prescribed working temperature and a non-superconducting phase showing no superconductivity at said prescribed working temperature, said method comprising:
    a step of forming a film of a Y-Ba-Cu oxide on a substrate by sputtering and performing heat treatment of said film in an oxygen atmosphere to convert the same into a superconducting film having said superconducting phase; and
    a step of applying a laser beam from a YAG laser to a part of said superconducting phase of said superconducting film to cause transition of said part of said superconducting phase into said non-superconducting phase.

* * * * *